(12) United States Patent
Zhang

(10) Patent No.: US 7,411,281 B2
(45) Date of Patent: Aug. 12, 2008

(54) INTEGRATED CIRCUIT DEVICE PACKAGE HAVING BOTH WIRE BOND AND FLIP-CHIP INTERCONNECTIONS AND METHOD OF MAKING THE SAME

(75) Inventor: Tonglong Zhang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/870,928

(22) Filed: Jun. 21, 2004

(65) Prior Publication Data

US 2005/0280141 A1    Dec. 22, 2005

(51) Int. Cl.
*H01L 23/02* (2006.01)

(52) U.S. Cl. .................. 257/678; 257/686; 257/707; 257/E33.075; 257/E23.08

(58) Field of Classification Search ................ 257/678, 257/703, 704, 707, 778, 698, 738, 685, 686, 257/693, 706, 33.075, E23.001, E23.08, E23.031
See application file for complete search history.

(56) References Cited

U.S. PATENT DOCUMENTS

| | | |
|---|---|---|
| 3,790,866 A | 2/1974 | Meyer et al. |
| 4,611,238 A | 9/1986 | Lewis et al. |
| 5,045,921 A | 9/1991 | Lin et al. |
| 5,065,281 A | 11/1991 | Hernandez et al. |
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |

(Continued)

FOREIGN PATENT DOCUMENTS

EP    0 573 297 A2    12/1993

(Continued)

OTHER PUBLICATIONS

Amkor package date sheet, "SuperFC®", from http://www.amkor.com/products/all_datasheets/superfc.pdf, 2 pages (Jan. 2003).

(Continued)

*Primary Examiner*—Howard Weiss
*Assistant Examiner*—Hoa B Trinh
(74) *Attorney, Agent, or Firm*—Sterne, Kessler, Goldstein & Fox PLLC

(57) ABSTRACT

Die-down array integrated circuit (IC) device packages with enhanced thermal, electrical, and input/output properties are presented. A die-down array IC device package includes a heat spreader having a central cavity. A first substrate surface is coupled to the heat spreader. A central opening through the substrate overlaps the central cavity. Alternatively, the heat spreader is formed by coupling a ring-shaped body to a planar heat spreader. The first substrate surface is coupled to the ring-shaped body and the substrate central opening overlaps a central opening through the ring-shaped body. An array of electrically conductive terminals is coupled to a second substrate surface. An IC die is mounted to the heat spreader within the central cavity. Bond pads on the die are coupled to corresponding bond pads on the substrate with a plurality of wire bonds. Electrically conductive bumps on the die are coupled to corresponding bond pads on an interposer.

21 Claims, 10 Drawing Sheets

U.S. PATENT DOCUMENTS

| | | | |
|---|---|---|---|
| 5,366,589 A | 11/1994 | Chang | |
| 5,394,009 A | 2/1995 | Loo | |
| 5,397,917 A | 3/1995 | Ommen et al. | |
| 5,397,921 A | 3/1995 | Karnezos | |
| 5,409,865 A | 4/1995 | Karnezos | |
| 5,433,631 A | 7/1995 | Beaman et al. | |
| 5,438,216 A | 8/1995 | Juskey et al. | |
| 5,474,957 A | 12/1995 | Urushima | |
| 5,490,324 A | 2/1996 | Newman | |
| 5,534,467 A | 7/1996 | Rostoker | |
| 5,541,450 A | 7/1996 | Jones et al. | |
| 5,552,635 A | 9/1996 | Kim et al. | |
| 5,572,405 A | 11/1996 | Wilson et al. | |
| 5,578,869 A | 11/1996 | Hoffman et al. | |
| 5,583,377 A | 12/1996 | Higgins, III | |
| 5,583,378 A | 12/1996 | Marrs et al. | |
| 5,642,261 A | 6/1997 | Bond et al. | |
| 5,648,679 A | 7/1997 | Chillara et al. | |
| 5,650,659 A | 7/1997 | Mostafazadeh et al. | |
| 5,650,662 A | 7/1997 | Edwards et al. | |
| 5,691,567 A | 11/1997 | Lo et al. | |
| 5,717,252 A | 2/1998 | Nakashima et al. | |
| 5,736,785 A | 4/1998 | Chiang et al. | |
| 5,744,863 A | 4/1998 | Culnane et al. | |
| 5,796,170 A | 8/1998 | Marcantonio | |
| 5,798,909 A | 8/1998 | Bhatt et al. | |
| 5,801,432 A | 9/1998 | Rostoker et al. | |
| 5,835,355 A | 11/1998 | Dordi | |
| 5,843,808 A | 12/1998 | Karnezos | |
| 5,844,168 A | 12/1998 | Schueller et al. | |
| 5,856,911 A | 1/1999 | Riley | |
| 5,866,949 A | 2/1999 | Schueller | |
| 5,883,430 A | 3/1999 | Johnson | |
| 5,889,321 A | 3/1999 | Culnane et al. | |
| 5,889,324 A | 3/1999 | Suzuki | |
| 5,894,410 A | 4/1999 | Barrow | |
| 5,895,967 A | 4/1999 | Stearns et al. | |
| 5,901,041 A | 5/1999 | Davies et al. | |
| 5,903,052 A | 5/1999 | Chen et al. | |
| 5,905,633 A | 5/1999 | Shim et al. | |
| 5,907,189 A | 5/1999 | Mertol | |
| 5,907,903 A | 6/1999 | Ameen et al. | |
| 5,920,117 A | 7/1999 | Sono et al. | |
| 5,949,137 A | 9/1999 | Domadia et al. | |
| 5,953,589 A | 9/1999 | Shim et al. | |
| 5,972,734 A | 10/1999 | Carichner et al. | |
| 5,976,912 A | 11/1999 | Fukutomi et al. | |
| 5,977,626 A | 11/1999 | Wang et al. | |
| 5,977,633 A | 11/1999 | Suzuki et al. | |
| 5,982,621 A | 11/1999 | Li | |
| 5,986,340 A | 11/1999 | Mostafazadeh et al. | |
| 5,986,885 A | 11/1999 | Wyland | |
| 5,998,241 A | 12/1999 | Niwa | |
| 5,999,415 A | 12/1999 | Hamzehdoost | |
| 6,002,147 A | 12/1999 | Iovdalsky et al. | |
| 6,002,169 A | 12/1999 | Chia et al. | |
| 6,011,304 A | 1/2000 | Mertol | |
| 6,011,694 A | 1/2000 | Hirakawa | |
| 6,020,637 A | 2/2000 | Karnezos | |
| 6,028,358 A | 2/2000 | Suzuki | |
| 6,034,427 A | 3/2000 | Lan et al. | |
| 6,040,984 A | 3/2000 | Hirakawa | |
| 6,057,601 A | 5/2000 | Lau et al. | |
| 6,060,777 A | 5/2000 | Jamieson et al. | |
| 6,064,111 A | 5/2000 | Sota et al. | |
| 6,069,407 A | 5/2000 | Hamzehdoost | |
| 6,077,724 A | 6/2000 | Chen | |
| 6,084,297 A | 7/2000 | Brooks et al. | |
| 6,084,777 A | 7/2000 | Kalidas et al. | |
| 6,114,761 A | 9/2000 | Mertol et al. | |
| 6,117,797 A | 9/2000 | Hembree | |
| 6,122,171 A | 9/2000 | Akram et al. | |
| 6,133,064 A | 10/2000 | Nagarajan et al. | |
| 6,140,707 A | 10/2000 | Plepys et al. | |
| 6,160,705 A | 12/2000 | Stearns et al. | |
| 6,162,659 A | 12/2000 | Wu | |
| 6,163,458 A | 12/2000 | Li | |
| 6,166,434 A | 12/2000 | Desai et al. | |
| 6,184,580 B1 | 2/2001 | Lin | |
| 6,201,300 B1 | 3/2001 | Tseng et al. | |
| 6,207,467 B1 | 3/2001 | Vaiyapuri et al. | |
| 6,212,070 B1 | 4/2001 | Atwood et al. | |
| 6,242,279 B1 | 6/2001 | Ho et al. | |
| 6,246,111 B1 | 6/2001 | Huang et al. | |
| 6,278,613 B1 | 8/2001 | Fernandez et al. | |
| 6,288,444 B1 | 9/2001 | Abe et al. | |
| 6,313,521 B1 | 11/2001 | Baba | |
| 6,313,525 B1 | 11/2001 | Sasano | |
| 6,347,037 B2 | 2/2002 | Iijima et al. | |
| 6,362,525 B1 | 3/2002 | Rahim | |
| 6,365,980 B1 | 4/2002 | Carter, Jr. et al. | |
| 6,369,455 B1 | 4/2002 | Ho et al. | |
| 6,380,623 B1 | 4/2002 | Demore | |
| 6,395,582 B1 * | 5/2002 | Sohn et al. | 438/111 |
| 6,462,274 B1 | 10/2002 | Shim et al. | |
| 6,472,741 B1 | 10/2002 | Chen et al. | |
| 6,525,942 B2 | 2/2003 | Huang et al. | |
| 6,528,869 B1 | 3/2003 | Glenn et al. | |
| 6,528,892 B2 | 3/2003 | Caletka et al. | |
| 6,541,832 B2 | 4/2003 | Coyle | |
| 6,545,351 B1 | 4/2003 | Jamieson et al. | |
| 6,552,266 B2 | 4/2003 | Carden et al. | |
| 6,552,428 B1 | 4/2003 | Huang et al. | |
| 6,552,430 B1 | 4/2003 | Perez et al. | |
| 6,563,712 B2 | 5/2003 | Akram et al. | |
| 6,583,516 B2 | 6/2003 | Hashimoto | |
| 6,602,732 B2 | 8/2003 | Chen | |
| 6,614,660 B1 | 9/2003 | Bai et al. | |
| 6,617,193 B1 | 9/2003 | Toshio et al. | |
| 6,657,870 B1 | 12/2003 | Ali et al. | |
| 6,664,617 B2 | 12/2003 | Siu | |
| 6,724,071 B2 | 4/2004 | Combs | |
| 6,724,080 B1 | 4/2004 | Ooi et al. | |
| 2001/0001505 A1 | 5/2001 | Schueller et al. | |
| 2001/0040279 A1 | 11/2001 | Mess et al. | |
| 2001/0045644 A1 | 11/2001 | Huang | |
| 2002/0053731 A1 | 5/2002 | Chao et al. | |
| 2002/0072214 A1 | 6/2002 | Yuzawa et al. | |
| 2002/0079562 A1 | 6/2002 | Zhao et al. | |
| 2002/0079572 A1 | 6/2002 | Khan et al. | |
| 2002/0096767 A1 | 7/2002 | Cote et al. | |
| 2002/0098617 A1 | 7/2002 | Lee et al. | |
| 2002/0109226 A1 | 8/2002 | Khan et al. | |
| 2002/0135065 A1 | 9/2002 | Zhao et al. | |
| 2002/0171144 A1 | 11/2002 | Zhang et al. | |
| 2002/0180040 A1 | 12/2002 | Camenforte et al. | |
| 2002/0185717 A1 | 12/2002 | Eghan et al. | |
| 2002/0185720 A1 | 12/2002 | Khan et al. | |
| 2002/0185722 A1 | 12/2002 | Zhao et al. | |
| 2002/0185734 A1 | 12/2002 | Zhao et al. | |
| 2002/0185750 A1 | 12/2002 | Khan et al. | |
| 2002/0190361 A1 | 12/2002 | Zhao et al. | |
| 2002/0190362 A1 | 12/2002 | Khan et al. | |
| 2003/0057550 A1 | 3/2003 | Zhao et al. | |
| 2003/0111726 A1 | 6/2003 | Khan et al. | |
| 2003/0137057 A1 * | 7/2003 | Honda | 257/778 |
| 2003/0138613 A1 | 7/2003 | Thoman et al. | |
| 2003/0146503 A1 | 8/2003 | Khan et al. | |
| 2003/0146506 A1 | 8/2003 | Khan et al. | |
| 2003/0146509 A1 | 8/2003 | Zhao et al. | |
| 2003/0146511 A1 | 8/2003 | Zhao et al. | |
| 2003/0179549 A1 | 9/2003 | Zhong et al. | |
| 2003/0179556 A1 | 9/2003 | Zhao et al. | |
| 2004/0072456 A1 | 4/2004 | Dozier, II et al. | |

2004/0113284 A1    6/2004  Zhao et al.

FOREIGN PATENT DOCUMENTS

| EP | 0 504 411 B1 | 6/1998 |
| FR | 2 803 098 A3 | 6/2001 |
| JP | 61-49446 A | 3/1986 |
| JP | 7-283336 A | 10/1995 |
| JP | 10-50877 A | 2/1998 |
| JP | 10-189835 A | 7/1998 |
| JP | 10-247702 A | 9/1998 |
| JP | 10-247703 A | 9/1998 |
| JP | 11-17064 A | 1/1999 |
| JP | 11-102989 A | 4/1999 |
| JP | 2000-286294 A | 10/2000 |
| JP | 2001-68512 A | 3/2001 |
| TW | 383908 | 3/2000 |
| TW | 417219 | 1/2001 |

OTHER PUBLICATIONS

Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).

Brofman, P.J. et al.,"Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).

Harper, C.A. (ed.), *Electronic Packaging and Interconnection Handbook*, Third Edition, pp. 7.58-7.59, ISBN No. 0-07-134745-3, McGraw-Hill Companies (2000).

Lin, S. and Chang, N., "Challenges in Power-Ground Integrity," *Proceedings Of The 2001 International Conference On Computer-Aided Design*, pp. 651-654 (Nov. 4-8, 2001).

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal Of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE Transactions On Very Large Scale Integration (VLSI) Systems*, vol. 10, No. 4, pp. 487-493 (Aug. 2002).

Ahn, S.H. and Kwon, Y.S., "Popcorn Phenomena in a Ball Grid Array Package", *IEEE Transactions on Components, Packaging, and Manufacturing Technology Part B: Advanced Packaging*, IEEE, Aug. 1995, vol. 18, No. 3, pp. 491-495.

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International , Aug. 28-Sep. 1, 1994, San Jose, California, pp. 189-194.

Andrews, M., "Trends in Ball Grid Array Technology," *Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs QFP: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", *IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translation of JP 10-247702, published Sep. 14, 1998, 8 pages.

English-language Abstract of JP 10-247703, published Sep. 14, 1998, 1 page, printed from http://v3.espacenet.com.

English-language Abstract of JP 10-050877, published Feb. 20, 1998, 1 page, printed from http://v3.espacenet.com.

English-language Translation of JP 11-102989, published Apr. 14, 1999, 24 pages.

English-language Abstract of JP 11-017064, published Jan. 22, 1999, 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1986, 1 page, printed from http://v3.espacenet.com.

English-language Abstract of JP 7-283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Count PBGA Assembly: Solder Defect Failure Modes and Root Cause Analysis", *Surface Mount International Proceedings of the Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging, and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Testing: New Package Offers Promise but Must Clear Technology Hurdles.", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE, 1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques of Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes On QFPs", *Advanced Packaging*, IHS Publishing Group, Winter 1993, vol. 2, No. 1, pp. 38-39.

Houghten, J.L., "Plastic Ball-Grid Arrays Continue To Evolve", *Electronic Design*, Feb. 6, 1995, pp. 141-146.

"How To Give Your BGAs A Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Relability of BGA Solder Interconnections", *Surface Mount Technology Magazine*, IHS Publishing Group, Sep. 1994, vol. 8, No. 9, pp. 14-15.

Johnson, R. et al., "A Feasibility Study of of Ball Grid Array Packaging", *National Electronic Packaging and Production Conference East '93*, Boston, Massachusetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array National Symposium*, Dallas, Texas, Mar. 29-30, 1995, pp. 2-21.

Karnezos, M., "An EPBGA Alternative," *Advanced Packaging*, Jun. 1998, pp. 90, 92, 94, and 96.

Kawahara, T. et al., "Ball Grid Array Type Package By Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI Logic Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthroughs Achieved with the New *Super*BGA® Package", *1995 International Electronics Packaging Conference*, San Diego, California, Sep. 24-27, 1995, pp. 565-576.

Marrs, R.C. and Olachea, G., "BGAs for MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaertl, L., "How IC Packages Affect PCB Design", *Surface Mount Technology Magazine*, Feb. 1995, vol. 9, No. 2, pp. 114-116.

Mearing, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P, and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26-28.

"Pad Array Improves Density", *Electronic Packaging & Production*, Cahners Publishing Company, May 1992, pp. 25-26.

Partridge, J. and Viswanadham, P., "Organic Carrier Requirements for Flip Chip Assemblies", *Journal of Surface Mount Technology*, Surface Mount Technology Association, Jul. 1994, pp. 15-20.

Sakaguchi, H., "BGA Mounting Technology," pp. 1-4, date and source unknown.

Schmolze, C. and Fraser, A., "SPICE Modeling Helps Enhance BGA Performance", *Electronic Packaging & Production*, Jan. 1995, pp. 50-52.

Schueller, R.D. et al., "Performance and Reliability of a Cavity Down Tape BGA Package," *IEEE Electronic Packaging Technology Conference*, 1997, pp. 151-162.

*Semiconductor Group Package Outlines Reference Guide*, Texas Instruments, 1995, entire document submitted.

Shimizu, J., "Plastic Ball Grid Array Coplanrity", *Surface Mount International Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

Solberg, V., "Interconnection Structure Preparation: Impact of Material Handling and PCB Surface Finish on SMT Assembly Process Yield", *Ball Grid Array National Symposium*, Dallas Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207-213.

Tuck, J., "BGA Technology Branches Out", *Circuits Assembly*, Feb. 1995, vol. 6, No. 2, pp. 24, 26, and 28.

"Tutorial and Short Courses", *45th Electronic Components & Technology Conference*, May 21-24, 1995, Las Vegas, Nevada, IEEE, 4 pages.

Vardaman, E. J. and Crowley, R.T., "Worldwide Trends In Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West '95*, Reed Exhibition Companies, Feb. 26-Mar. 2, 1995, Anaheim, California, pp. 1530-1541.

Zamborsky, E., "BGAs in the Assembly Process", *Circuits Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented and $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Product", *Electronic Packaging & Production (Special Supplement)*, Cahners Publishing Company, Aug. 1994 (Supplement), p. 41.

Freyman, B. and Petrucci, M., "High-Pincount PBGAs: Implementation Into Volume Manufacturing," *Advanced Packaging*, An IHS Group Publication, May/Jun. 1995, pp. 44-46.

English-language Abstract of FR 2803098, published Jun. 29, 2001, 1 page, printed from http://v3.espacenet.com.

English-language Summary of Decision of Rejection from Taiwanese Application No. 91108573, 5 pages.

Zhao et al., U.S. Appl. No. 10/284,340, filed Oct. 31, 2002, entitled "Ball Grid Array Package With Patterned Stiffener Layer," 137 pages.

Ramirez, C. and Fauser, S., "Fatigue Life Comparison of The Perimeter and Full Plastic Ball Grid Array", *Surface Mount International Conference Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27-Mar. 4, 1994, Anaheim, California, pp. 1277-1282.

Rooks, S., "X-Ray Inspection of Flip Chip Using Digital Tomosynthesis", *Surface Mount International Proceedings of the Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

\* cited by examiner

Fill the space between the IC die and the interposer with an underfill material ~1005

FIG. 10A

Encapsulate the IC die and wire bonds with an encapsulating material ~1010

FIG. 10B

INTEGRATED CIRCUIT DEVICE PACKAGE HAVING BOTH WIRE BOND AND FLIP-CHIP INTERCONNECTIONS AND METHOD OF MAKING THE SAME

BACKGROUND OF THE INVENTION

1. Field of the Invention

The invention relates generally to the field of integrated circuit (IC) device packaging technology and, more particularly to IC device packages with enhanced thermal, electrical, and input/output (I/O) properties.

2. Related Art

IC semiconductor dies are typically mounted in or on a package that is attached to a printed circuit board (PCB). An array IC device package includes a plurality of electrically conductive terminals (e.g., solder balls, pins, pads, etc.) arranged in an array (i.e., columns and rows) on a bottom surface of a package substrate. Signals from an IC die mounted on a surface of the substrate are routed through the substrate to the electrically conductive terminals on the bottom surface. The electrically conductive terminals are configured to be attached to the PCB. Example array IC device packages include ball grid array (BGA), pin grid array (PGA), and land grid array (LGA) packages.

Array IC device packages can have die-up and die-down configurations. In die-up packages, the IC die is mounted on a top surface of the substrate, opposite the surface to which the electrically conductive terminals are attached. In die-down packages, the IC die is mounted on the bottom surface of the substrate, on the same surface where the electrically conductive terminals are located.

BRIEF SUMMARY OF THE INVENTION

The present invention is directed to integrated circuit (IC) device packages that provide enhanced thermal, electrical, and input/output (I/O) performance, and methods for making the same.

IC device packages are described herein having an IC die coupled to a substrate with at least one wire bond, and an interposer coupled to the IC die in a flip-chip fashion. Example embodiments of the present invention are described below.

In an embodiment of the present invention, a die-down array IC device package includes a heat spreader having a first surface with a central cavity formed therein. The package further includes a substrate having a first surface coupled to the first surface of the heat spreader. An array of electrically conductive terminals is coupled to a second surface of the substrate. A central opening through the substrate overlaps the central cavity. The package further includes an IC die, which has a first surface mounted to the first surface of the heat spreader, within the central cavity. At least one wire bond couples at least one bond pad on a second surface of the IC die to at least one bond pad on the second surface of the substrate. The package further includes an interposer. A plurality of electrically conductive bumps on the second surface of the IC die is coupled to corresponding bond pads on a first surface of the interposer.

In another embodiment of the present invention, the die-down array IC device package includes an underfill material that fills a space between the IC die and the interposer, and an encapsulating material that encapsulates the IC die and the at least one wire bond.

In another embodiment of the present invention, the die-down array IC device package includes a heat slug coupled to a second surface of the interposer.

In another embodiment of the present invention, the heat spreader includes a substantially planar body having opposing first and second surfaces, and a ring-shaped body having a central opening that is open at first and second surfaces of the ring-shaped body. The first surface of the ring-shaped body is coupled to the first surface of the substantially planar body. The second surfaces of the ring-shaped body and the substantially planar body form the first and second surfaces, respectively, of the heat spreader. The central opening through the ring-shaped body and a portion of the first surface of the substantially planar body that is exposed through the central opening form the central cavity.

In another embodiment of the present invention, a method of making a die-down array IC device package includes the step of coupling a first surface of a substrate to a first surface of a heat spreader. The method further includes the step of mounting a first surface of an IC die to the first surface of the heat spreader, within a central cavity formed in the first surface of the heat spreader. The method further includes the step of coupling a plurality of bond pads on a second surface of the IC die to corresponding bond pads on a second surface of the substrate with a plurality of wire bonds. The method further includes the step of coupling a first surface of an interposer to the second surface of the IC die so that a plurality of electrically conductive bumps on the second surface of the IC die is coupled to corresponding bond pads on the first surface of the interposer.

In another embodiment of the present invention, the method further includes the steps of filling a space between the IC die and the interposer with an underfill material, and encapsulating the IC die and the plurality of wire bonds with an encapsulating material.

In another embodiment of the present invention, the method further includes the step of coupling a heat slug to a second surface the interposer.

In another embodiment of the present invention, the method includes the step of coupling a first surface of a ring-shaped body to a first surface of a substantially planar body to form the heat spreader. Second surfaces of the ring-shaped body and the substantially planar body form the first and second surfaces of said heat spreader, respectively. The central opening through the substrate overlaps a central opening through the ring-shaped body that is open at the first and second surfaces of the ring-shaped body.

Further embodiments, features, and advantages of the present invention, as well as the structure and operation of various example embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention. The drawing in which an element first appears is typically indicated by the leftmost digit(s) in the corresponding reference number.

Figure 1A:
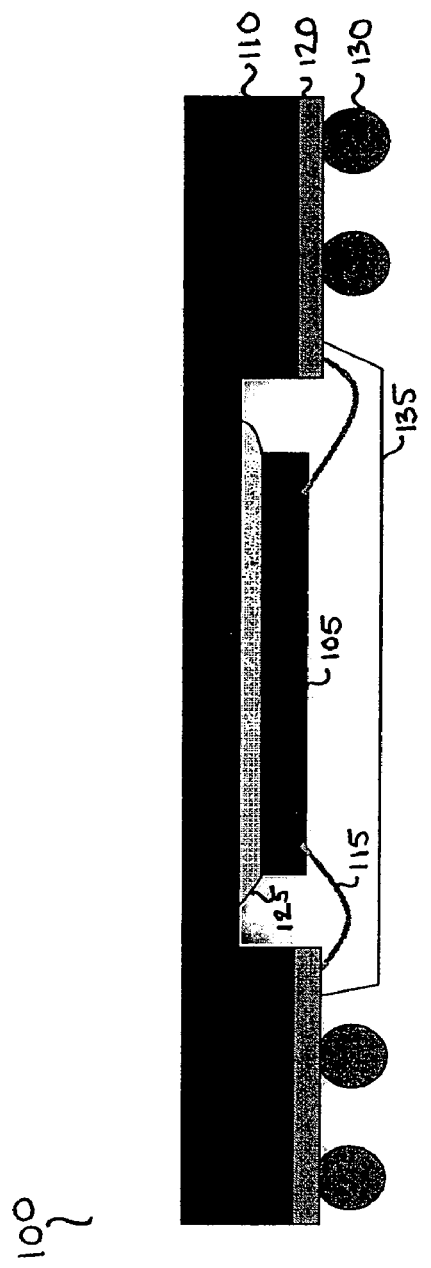
FIG. 1A illustrates a cross-sectional view of a conventional die-down BGA package with wire bond interconnections.

FIGS. 6-9, 10A, and 10B show flowcharts providing example steps for assembling die-down array IC device packages with enhanced thermal, electrical, and/or input/output (I/O) performance, in accordance with example embodiments of the present invention.

DETAILED DESCRIPTION OF THE INVENTION

Overview

Some conventional array integrated circuit (IC) device packages have wire bond interconnections to couple signals of the IC die from corresponding bond pads on the active surface of the IC die to the package substrate. Other conventional array IC device packages have flip-chip interconnections to couple signals of the IC die from an array of conductive bumps on the active surface of the IC die to the package substrate. The package substrate has internal routing that electrically couples the signals of the IC die to an array of electrically conductive terminals on a bottom surface of the substrate, and the package is typically mounted to a printed circuit board (PCB).

Conventional array IC device packages having only wire bond interconnections to route signals from the IC die suffer from limited thermal and electrical performance. For example, thermal performance is limited because there is no direct thermal path from the active surface of the IC die to the PCB. Electrical performance is also limited because there is no direct electrical path for routing signals from the center of the IC die to the PCB. For example, signals routed from the center of the IC die traverse a longer electrical path than signals routed from an edge. Relatively short electrical paths are desirable because they introduce less resistance than relatively long electrical paths. Signals traversing relatively long electrical paths can experience significant drops in potential due to the increased resistance.

Furthermore, conventional IC device packages having only wire bond interconnections or having only flip-chip interconnections to route signals from the IC die suffer from limited input/output (I/O) performance. In order to achieve more I/Os with wire bond interconnections, the minimum pitch of the I/O pads on the IC die must be reduced accordingly. In order to route more I/Os from the IC die to the PCB with flip-chip interconnections, more substrate layers are required. However, the cost of high-density substrates increases with the number of layers required and, in some cases (e.g., when the flip-chip bump pitch is extremely dense), it is not possible with current technology to manufacture a substrate having a high enough density.

Therefore, what is needed are IC device packages that provide enhanced thermal, electrical, and I/O performance.

The present invention is directed to IC device packages having enhanced thermal, electrical, and I/O properties, and methods of making the same. In embodiments, an active surface of the IC die has at least one bond pad for wire bond interconnections to a package substrate, in addition to at least one electrically conductive bump for flip-chip interconnection to an interposer. The substrate and the interposer are configured to be coupled to a PCB.

In embodiments, enhanced thermal properties are present due to a direct thermal path from the active surface of the IC die to the PCB, through the interposer. In further embodiments, enhanced electrical properties are present due to a direct electrical path from the active surface of the IC die to the PCB, through the interposer. Additionally, because both wire bond pads and flip-chip bumps are used to interconnect signals, more I/O connections can be achieved compared to conventional IC device packages having either wire bond or flip-chip interconnections alone.

While example embodiments of the present invention described below are illustrated with a die-down configuration, it is noted that they can alternatively be implemented with a die-up configuration.

In the next section, conventional IC device packages are described. The subsequent section then describes example IC device package embodiments of the present invention, followed by a description of example embodiments for assembling IC device packages of the present invention. These embodiments are provided for illustrative purposes, and the present invention is not limited to these examples.

Conventional IC Device Packages

FIG. 1A illustrates a cross-sectional view of a conventional die-down ball grid array (BGA) package 100. BGA package 100 includes an IC die 105, a die attach adhesive 125, a heat spreader 110, and a package substrate 120. BGA package 100 further includes a plurality of wire bonds 115, a plurality of solder balls 130, and an encapsulating material 135. IC die 105 is mounted to heat spreader 110 in a die-down configuration with die attach adhesive 125. A first surface of substrate 120 is attached to heat spreader 110. Wire bonds 115 couple signals of IC die 105 to a second surface of substrate 120. Solder balls 130 are attached to the second surface of substrate 120. Solder balls 130 are reflowed to attach BGA package 100 to a PCB (not shown in FIG. 1A).

A thermal path is present in BGA package 100 from the active surface of IC die 105 to the PCB through encapsulating material 135. However, typical encapsulating materials 135 lack thermal conductivity. Alternatively, an indirect thermal path is present from the active surface of IC die 105 to the PCB through adhesive 125, heat spreader 110, substrate 120, and solder balls 130. Thus, BGA package 100 provides limited thermal performance because there is no direct thermally conductive path from the active surface of IC die 105 to the PCB. BGA package 100 also provides limited electrical performance. For example, routing signals from the center of IC die 105 to substrate 120 with wire bonds 115 introduces increased resistance because wire bonds 115 increase in length with distance from the edge of IC die 105. The increased resistance introduced by the longer electrical paths results in an undesirable drop in signal potential.

Figure 1B:
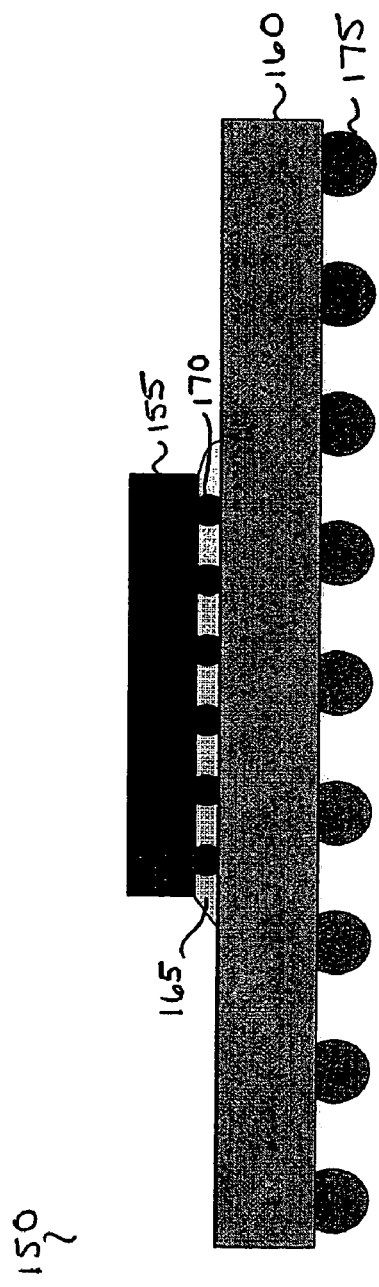
FIG. 1B illustrates a cross-sectional view of a conventional die-up BGA package with flip-chip interconnections.

FIG. 1B illustrates a cross-sectional view of a conventional die-up BGA package 150. BGA package 150 includes an IC die 155, a package substrate 160, a plurality of electrically conductive bumps 170, a plurality of solder balls 175, and an underfill material 165. IC die 155 is mounted to a first surface of substrate 160 in a die-up configuration. Electrically conductive bumps 170 of an active surface of IC die 155 are coupled to conductive pads on the first surface of substrate 160. Electrically conductive bumps 170 couple signals in IC die 155 to substrate 160. Underfill material 165 is applied between the active surface of IC die 155 and the first surface of substrate 160. Solder balls 175 are attached to a second surface of substrate 160. Solder balls 175 are reflowed to attach BGA package 150 to a PCB (not shown in FIG. 1B).

BGA package 150 provides limited I/O performance because a high-density substrate 160 with numerous routing layers would be needed to effectively route a large number of signals from the array of conductive pads on the first surface of substrate 160, to which IC die 155 is mounted. Numerous routing layers are undesirable because the cost of substrate 160 typically increases with the number of routing layers. In some cases (e.g., when the flip-chip bump pitch is extremely dense), it is not be possible with current technology to manufacture a substrate 160 having a high enough density.

IC Device Packages Having Both Wire Bond and Flip-Chip Interconnections

Figure 2A:
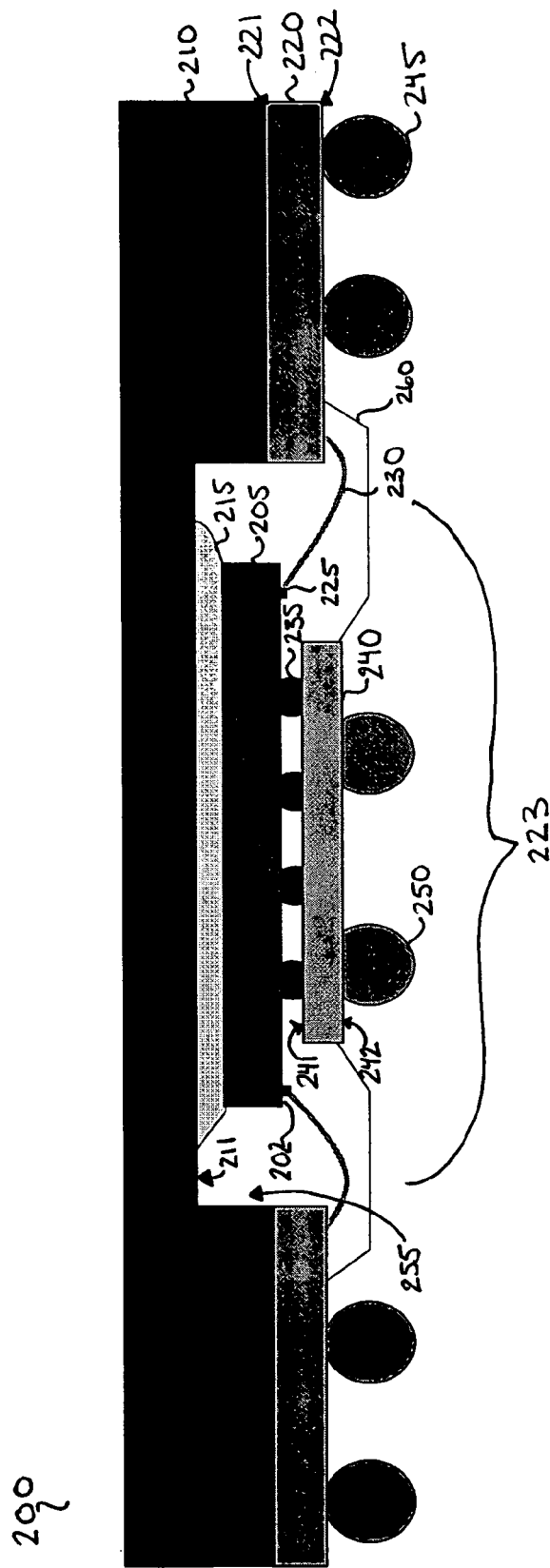
FIG. 2A illustrates a cross-sectional view of a die-down BGA package, having an interposer attached to a flip-chip mounted IC die, in accordance with an example embodiment of the present invention.

FIG. 2A illustrates a cross-sectional view of a die-down BGA package 200, in accordance with an embodiment of the present invention. BGA package 200 includes an IC die 205, a die attach material 215, a heat spreader 210 with a central cavity 255 formed therein, a package substrate 220, and an interposer 240. BGA package 200 further includes an encapsulating material 260, a plurality of wire bonds 230, a plurality of corresponding bond pads 225, a plurality of electrically conductive bumps 235, a plurality of solder balls 245, and a plurality of solder balls 250.

A first surface 211 of heat spreader 210 has central cavity 255 formed therein. Substrate 220 has a central opening 223 that is open at a first surface 221 and a second surface 222 of substrate 220. First surface 221 of substrate 220 is coupled to first surface 211 of heat spreader 210. Central opening 223 through substrate 220 overlaps central cavity 255 formed in heat spreader 210. IC die 205 is mounted in a die-down configuration with die attach adhesive 215 to first surface 211 in cavity 255 of heat spreader 210. Solder balls 245 are coupled to second surface 222 of substrate 220.

Bond pads 225 are located on a peripheral area of an active surface 202 of IC die 205. Wire bonds 230 connect bond pads 225 to second surface 222 of substrate 220 (e.g., to traces, contacts, ground rings, ground planes, voltage planes, etc. of substrate 220). Bond pads 225 can be any type of signal pads of IC die 205, including I/O pads, voltage pads, ground pads, test pads, etc.

Figure 2C:
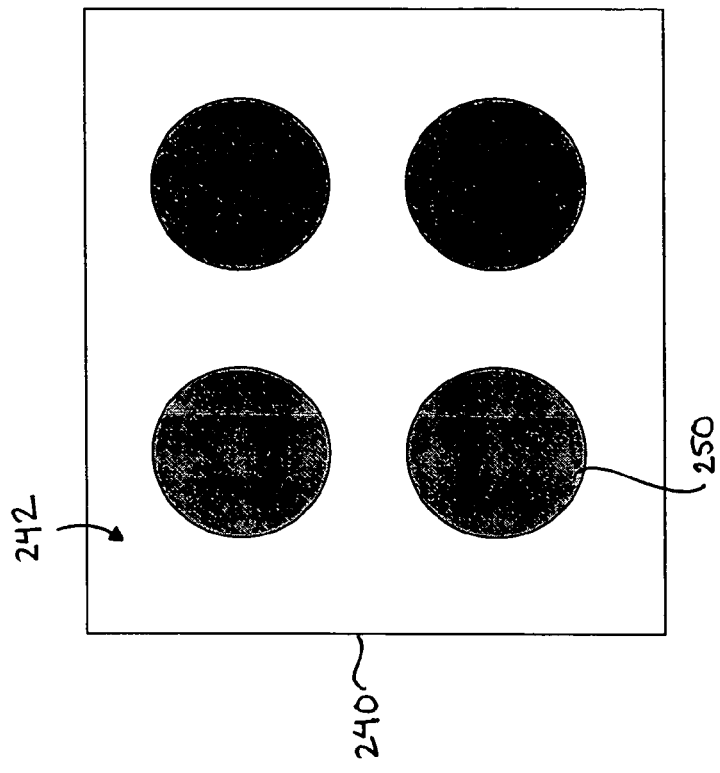
FIGS. 2B and 2C illustrate top and bottom views, respectively, of the interposer illustrated in FIG. 2A, in accordance with an example embodiment of the present invention.
Figure 2B:
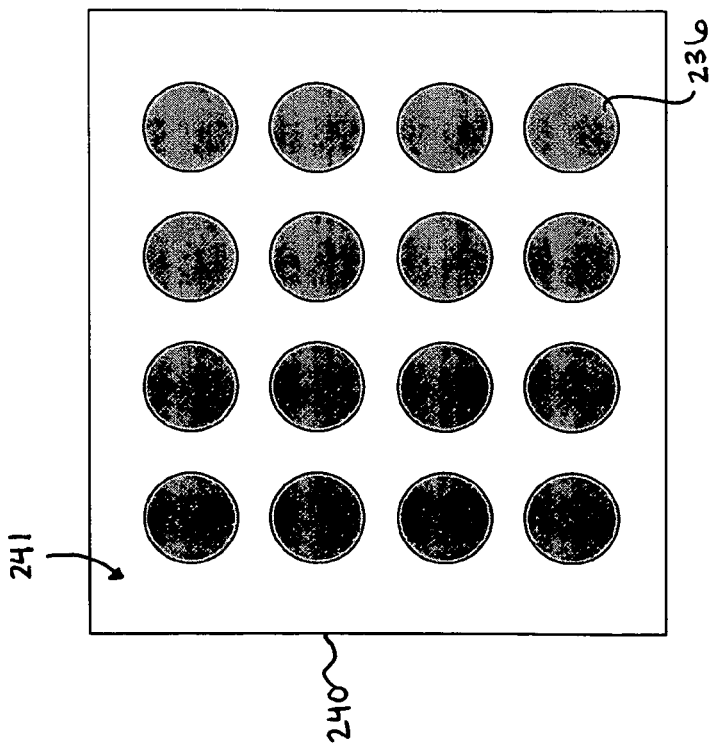

Electrically conductive bumps 235 are located on a central area of active surface 202 of IC die 205, and are arranged in any configuration, including an array (i.e., in columns and rows). Electrically conductive bumps 235 are flip-chip coupled to corresponding bond pads (not shown in FIG. 2A) on a first surface 241 of interposer 240. Solder balls 250 are coupled to a second surface 242 of interposer 240. FIGS. 2B and 2C illustrate example bond pad 236 and solder ball 250 configurations on first and second surfaces 241 and 242 of interposer 240, respectively, for BGA package 200 shown in FIG. 2A, according to an example embodiment of the present invention. It is noted that any number of bond pads 236 and solder balls 250 may be present in interposer 240, as is desired for the particular implementation.

Solder balls 245 and 250 are reflowed to attach BGA package 200 to a PCB. Solder balls 245 and 250 can be implemented with other types of electrically conductive terminals (e.g., pins, studs, other kinds of balls, etc.).

An encapsulating material 260 encapsulates IC die 205 and wire bonds 230. In another embodiment, shown in FIG. 2D, an underfill material 265 fills a space between active surface 202 of IC die 205 and first surface 241 of interposer 240. Underfill material 265 is typically applied before encapsulating material 260, but can also be applied after encapsulating material 260 is applied. Example materials for underfill material 265 include conventional underfill materials, including silicon oxide, or any other kind of underfill material. Underfill material 265 is typically different from encapsulating material 260 but, in some cases, underfill material 265 and encapsulating material 260 can be the same material.

Example materials for heat spreader 210 include copper, aluminum, aluminum based alloys, copper based alloys, ferromagnetic materials, laminated copper/iron, other metals and combinations of metals/alloys, other thermally and/or electrically conductive materials (e.g., ceramics, metallized plastics, etc.), and other materials described elsewhere herein. Machining, etching, stamping, and other techniques can be used to form central cavity 255 in first surface 211 of heat spreader 210. Example materials for die attach adhesive 215 include epoxy, such as a silver epoxy, solder, and other adhesive materials.

Example materials for substrate 220 include tape, laminate, ceramic, organic (e.g., BT, FR4, etc.), and other materials. Substrate 220 can have one or more electrical routing layers, which can be constructed through lamination, build-up, or other processes. Substrate 220 can further include single or multi-layer electrical conductive traces or planes.

Example materials for electrically conductive bumps 235 include lead/tin solder, gold, gold/tin, other metal or metal composites, electrically conductive epoxy, and other electrically conductive materials.

Example materials for interposer 240 include tape, metal, a substrate (e.g., laminate or ceramic), an IC, or any combination of these materials (e.g., tape with metal stiffener, tape with laminate or ceramic substrate, IC with metal slug, etc). Reflow process, thermal compression, thermal sonic bonding, and other methods can be used to attach interposer 240. Interposer 240 can be attached either before wafer dice or singulation (i.e., when IC die 205 is in wafer form) or after IC die 205 has been singulated, including when it is attached to heat spreader 210.

Advantageously, BGA package 200 includes both wire bond 230 and flip-chip 235 interconnections in the same package. Accordingly, BGA package 200 significantly increases the number of I/O signals that can be routed to and from IC die 205, without reducing the minimum pitch of I/O pads on IC die 205 or requiring substrate 220 be high-density. Additionally, BGA package 200 has enhanced thermal properties due to the more direct thermal path from active surface 202 of IC die 205 to the PCB, through interposer 240. BGA package 200 also has enhanced electrical properties due to the more direct electrical path from IC die 205 to the PCB, through interposer 240.

Figure 3:
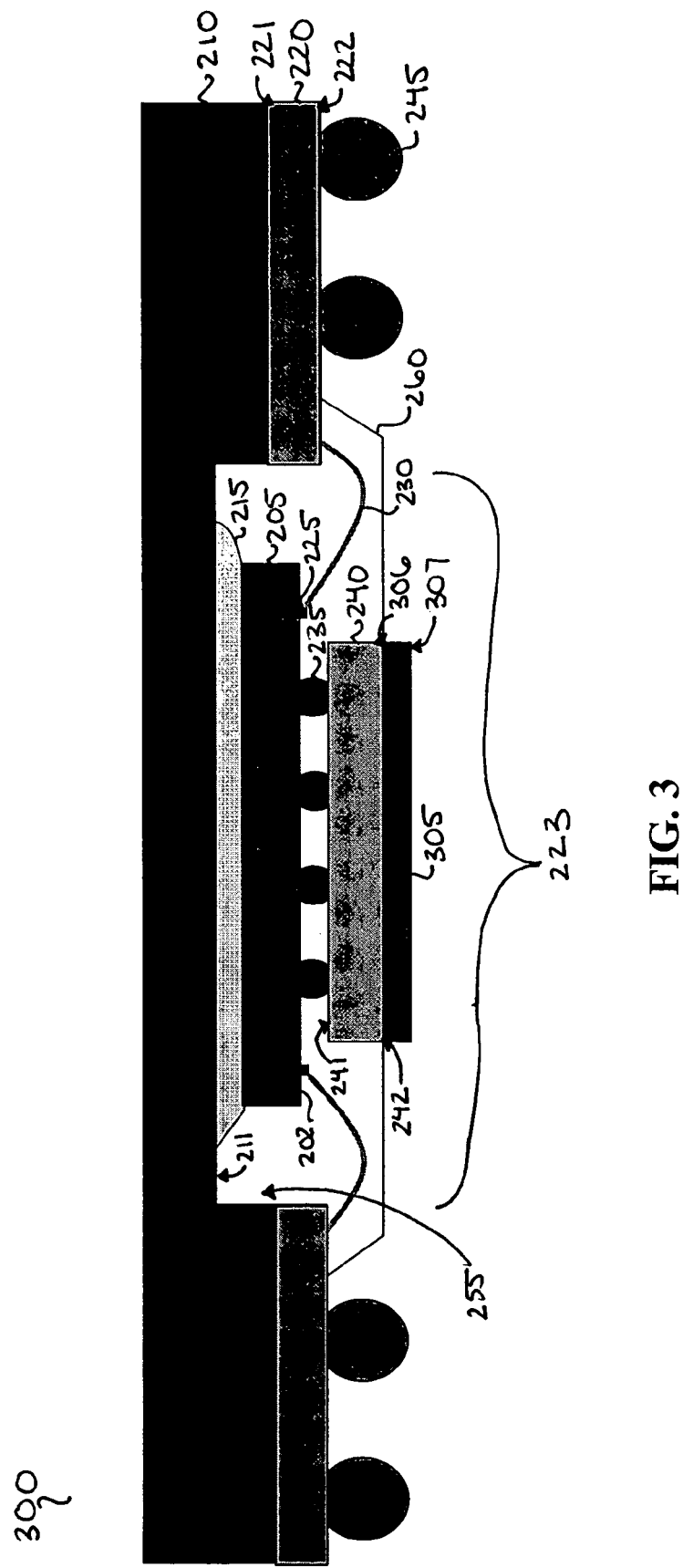
FIG. 3 illustrates a cross-sectional view of a die-down BGA package, having an interposer attached to a flip-chip mounted IC die and a heat slug attached to the interposer, in accordance with an example embodiment of the present invention.

FIG. 3 illustrates a cross-sectional view of a die-down BGA package 300, in accordance with an embodiment of the present invention. BGA package 300 is similar to BGA package 200, shown in FIG. 2A, except a heat slug 305 replaces solder balls 250 for additional thermal enhancement. Heat slug 305 has a first surface 306 coupled to second surface 242 of interposer 240. Heat slug 305 has a second surface 307, which is configured to be surface mounted to a PCB.

Example materials for heat slug 305 include copper, aluminum, other metals or combinations of metals/alloys, ceramics, and other thermally and/or electrically conductive materials. In an example embodiment, heat slug 305 is formed separately and then attached to interposer 240. In another embodiment, heat slug 305 is formed by depositing a plating layer on second surface 242 of interposer 240. Heat slug 305 can also be formed in other ways.

Alternatively, in another embodiment, BGA package 300 is configured without a separate heat slug 305. Instead, interposer 240 incorporates the function of heat slug 305, and second surface 242 of interposer 240 is configured to be mounted to the PCB.

In BGA package 300, a single electrical signal can be routed from IC die 205 to the PCB through heat slug 305. Accordingly, BGA package 300 is advantageous for routing a single power, ground, or other signal of IC die 205 to the PCB, through interposer 240 and heat slug 305.

In comparison, BGA package 200, shown in FIG. 2A, is advantageous for routing multiple I/O signals from IC die 205, through the center of the package, to the PCB. Because BGA package 200 has solder balls 250 instead of heat slug 305 (shown in FIG. 3), multiple I/O signals can be routed from IC die 205 to the PCB, through interposer 240 and solder balls 250. Accordingly, BGA package 200 provides a direct electrical path for routing critical I/O signals with less resistance and therefore little drop in signal potential.

Figure 4:
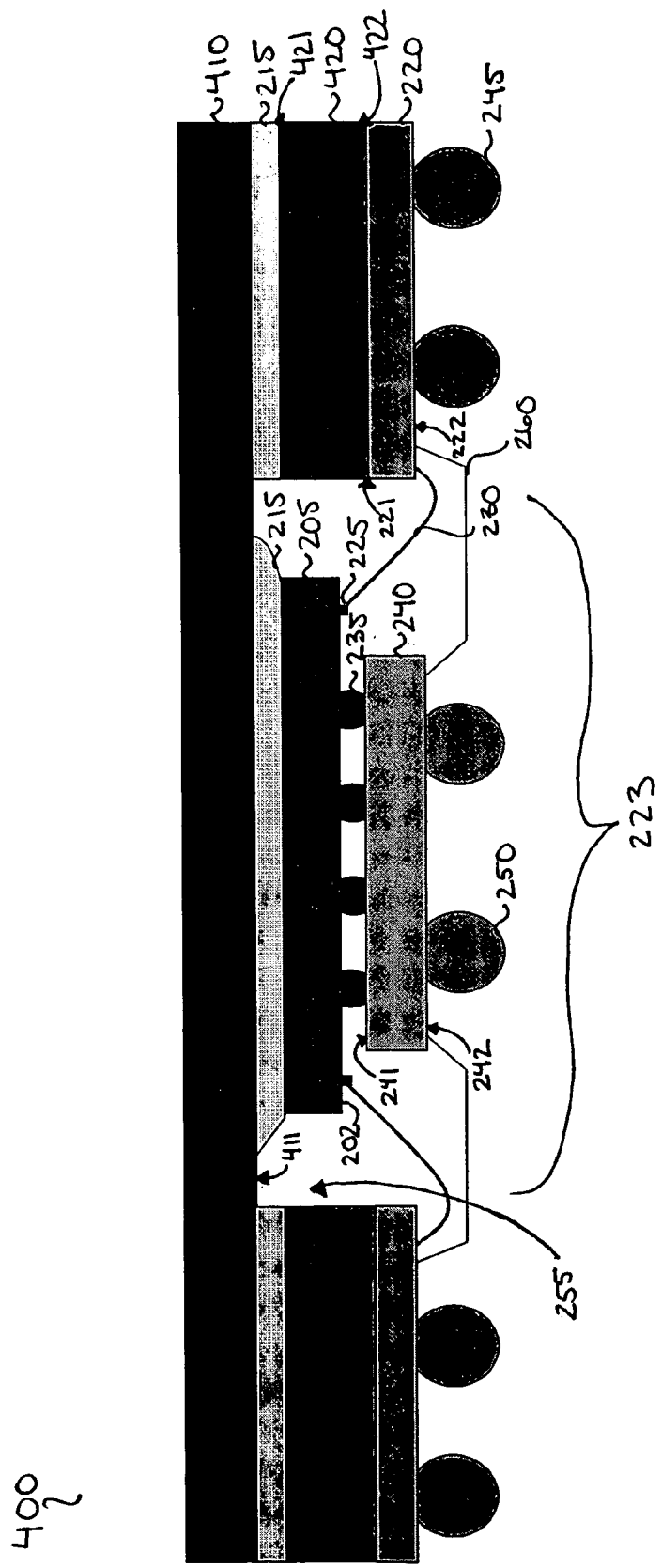
FIG. 4 illustrates a cross-sectional view of a die-down BGA package, having a two-piece heat spreader, and an interposer attached to a flip-chip mounted IC die, in accordance with an example embodiment of the present invention.

FIG. 4 illustrates a cross-sectional view of a die-down BGA package 400. BGA package 400 is similar to BGA package 200, shown in FIG. 2A, except that package 400 includes a two-piece heat spreader formed from a planar heat spreader 410 and a ring-shaped body 420.

BGA package 400 includes IC die 205, planar heat spreader 410, adhesive material 215, ring-shaped body 420, substrate 220, and interposer 240. BGA package 400 further includes plurality of wire bonds 230, plurality of corresponding bond pads 225, plurality of electrically conductive bumps 235, plurality of solder balls 245, and plurality of solder balls 250. Elements in FIG. 4 are generally similar to the corresponding elements shown in FIG. 2, with differences described below.

BGA package 400 includes a two-piece heat spreader formed by coupling ring-shaped body 420 to planar heat spreader 410. Ring-shaped body 420 has a central opening that is open at a first surface 421 and a second surface 422 of ring-shaped body 420. In BGA package 200 shown in FIG. 2A, central cavity 255 is formed in first surface 211 of heat spreader 210. In BGA package 400 shown in FIG. 4, central cavity 255 is formed by coupling first surface 421 of ring-shaped body 420 to a first surface 411 of planar heat spreader 410 with adhesive material 215. First surface 221 of substrate 220 is coupled to second surface 422 of ring-shaped body 420. Central opening 223 through substrate 220 overlaps central cavity 255. IC die 205 is mounted with adhesive material 215 in a die-down configuration to first surface 411 of heat spreader 410, within central cavity 255. Solder balls 245 are coupled to second surface 222 of substrate 220.

Example materials for heat spreader 410 and ring-shaped body 420 include copper, aluminum, aluminum based alloys, copper based alloys, ferromagnetic materials, laminated copper/iron, other metals and combinations of metals/alloys, other thermally and/or electrically conductive materials (e.g., ceramics, metallized plastics, etc.), and other materials described elsewhere herein. Heat spreader 410 and ring-shaped body 420 are typically made from the same material (e.g., to match coefficients of thermal expansion (CTE)), but can be made from different materials.

Advantageously, BGA package 400, like BGA package 200, described above, includes both wire bond 230 and flip-chip 235 interconnections in the same package. Therefore, BGA package 400 significantly increases the number of I/O signals that can be routed to and from IC die 205, without reducing the minimum pitch of I/O pads on IC die 205 or requiring substrate 220 be high-density. Additionally, BGA package 400 has enhanced thermal properties due to the more direct thermal path from active surface 202 of IC die 205 to the PCB, through interposer 240. BGA package 400 also has enhanced electrical properties due to the more direct electrical path from IC die 205 to the PCB, through interposer 240.

Figure 5:
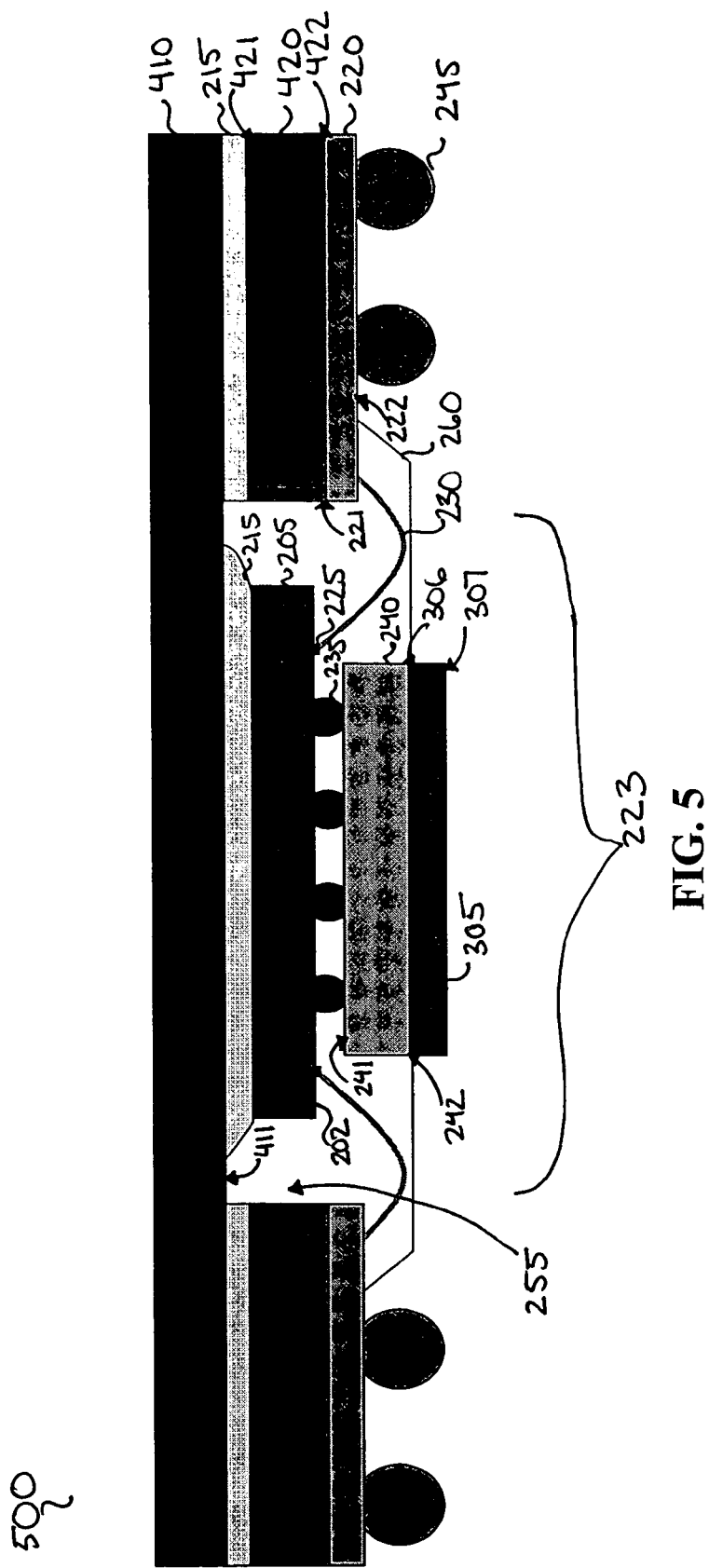
FIG. 5 illustrates a cross-sectional view of a die-down BGA package, having a two-piece heat spreader, an interposer attached to a flip-chip mounted IC die, and a heat slug attached to the interposer, in accordance with an example embodiment of the present invention.

FIG. 5 illustrates a cross-sectional view of a die-down BGA package 500. BGA package 500 is similar to BGA package 400 of FIG. 4, except heat slug 305 replaces solder balls 250 for additional thermal enhancement, similarly to BGA package 300 shown in FIG. 3. First surface 306 of heat slug 305 is coupled to second surface 242 of interposer 240. Second surface 307 of heat slug 305 is configured to be mounted to a PCB.

Alternatively, in another embodiment, BGA package 500 is configured without a separate heat slug 305. Instead, interposer 240 incorporates the function of heat slug 305, and second surface 242 of interposer 240 is configured to be mounted to the PCB.

Method of Assembling a Thermal, Electrical, and/or I/O Enhanced Package

Figure 6:
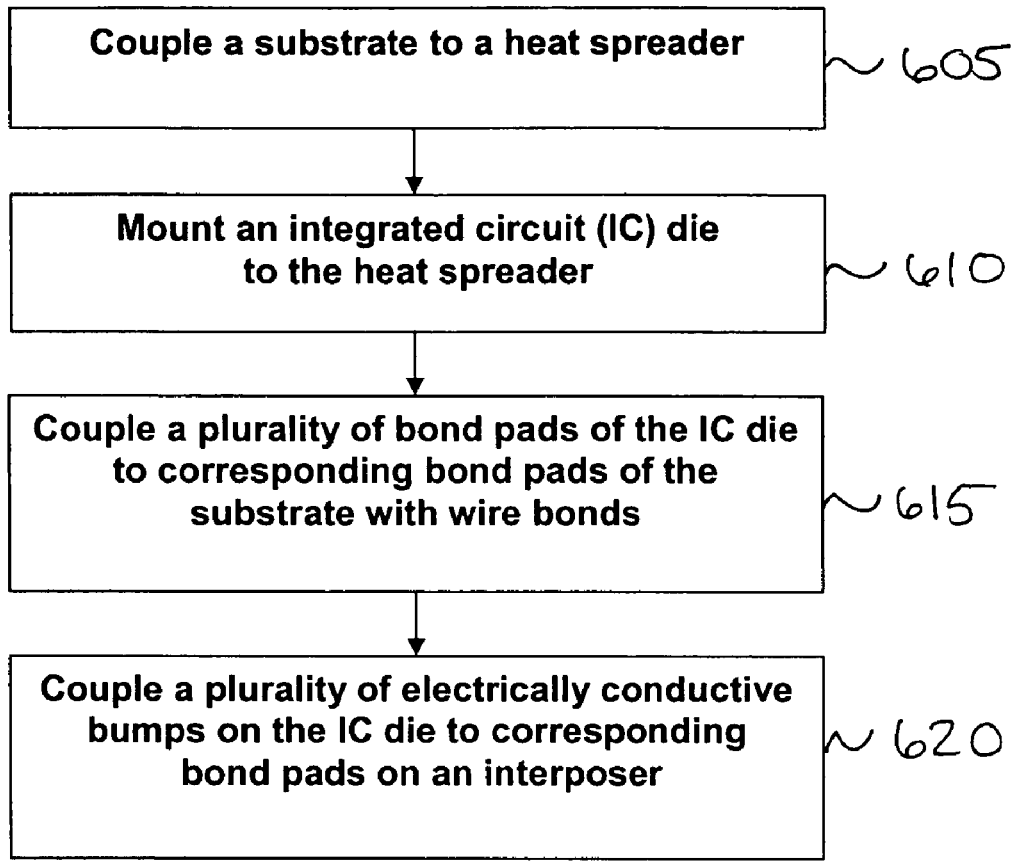

FIG. 6 shows flowchart 600, providing steps for assembling an array IC device package with enhanced thermal, electrical, and/or I/O properties, according to one or more embodiments of the present invention. FIGS. 7-9, 10A, and 10B provide additional optional steps, according to further embodiments of the present invention. The steps of FIGS. 6-9, 10A, and 10B do not necessarily have to occur in the order shown, as will be apparent to persons skilled in the relevant art(s) based on the teachings herein. Other operational and structural embodiments will be apparent to persons skilled in the relevant art(s) based on the following discussion. These steps are described in detail below.

Flowchart 600 is shown in FIG. 6, and begins with step 605. In step 605, a substrate is coupled to a heat spreader. For example, the substrate is substrate 220, and the heat spreader is heat spreader 210, as shown in FIGS. 2A and 3.

In step 610, an IC die is mounted to the heat spreader. For example, as shown in FIGS. 2A and 3, the IC die is mounted in a central cavity formed in the heat spreader, and the IC die is IC die 205, the heat spreader is heat spreader 210, the central cavity is central cavity 255, and the substrate is substrate 220.

In step 615, a plurality of bond pads on the IC die are coupled to corresponding bond pads on the substrate with wire bonds. For example, the IC die is IC die 205, the plurality of bond pads on the IC die is plurality of bond pads 225, the substrate is substrate 220, and the wire bonds are wire bonds 230, as shown in FIGS. 2A and 3-5.

In step 620, an interposer is coupled to the IC die so that a plurality of electrically conductive bumps on the IC die are coupled to corresponding bond pads on the interposer. For example, the IC die is IC die 205, the plurality of electrically conductive bumps on the IC die is plurality of electrically conductive bumps 235, and the interposer is interposer 240, as shown in FIGS. 2A and 3-5.

Figure 7:

Alternatively, in another embodiment, flowchart 600 includes the step shown in FIG. 7 for forming a two-piece heat spreader. In step 705, a ring-shaped body is coupled to a substantially planar heat spreader to form the heat spreader described in steps 605 and 610 of FIG. 6. For example, the ring-shaped body is ring-shaped body 420, and the planar heat spreader is planar heat spreader 410, as shown in FIGS. 4 and 5.

Figure 8:
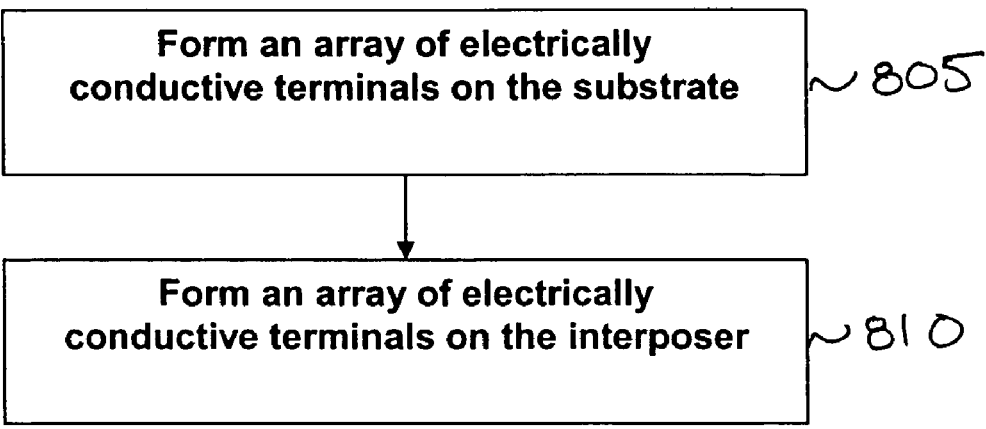

In another example embodiment, flowchart 600 includes one or more of the steps shown in FIG. 8. In step 805, an array of electrically conductive terminals is formed on the substrate. For example, the array of electrically conductive terminals formed on the substrate is plurality of solder balls 245, as shown in FIGS. 2A and 4.

In step 810, an array of electrically conductive terminals is formed on the interposer. For example, the array of electrically conductive terminals formed on the interposer is plurality of solder balls 250, as shown in FIGS. 2A and 4. The arrays of electrically conductive terminals formed on the substrate in step 805 and on the interposer in step 810 are configured to mount the package to a PCB.

Figure 9:
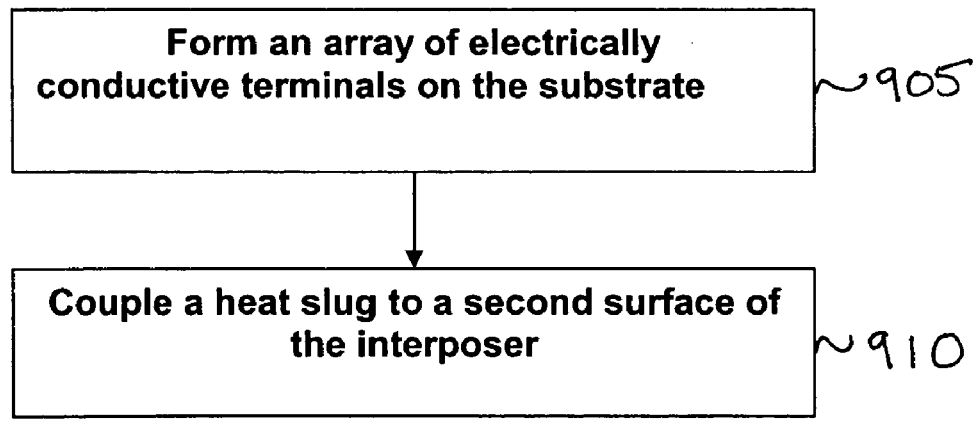

In an alternate example embodiment, flowchart 600 includes one or more of the steps shown in FIG. 9. In step 905, an array of electrically conductive terminals is formed on the substrate. For example, the array of electrically conductive terminals on the substrate is plurality of solder balls 245, as shown in FIGS. 3 and 5. Alternatively, the terminals can be pins, pads, or other terminal type.

In step 910, a heat slug is coupled to the interposer. For example, the heat slug is heat slug 305, and the interposer is interposer 240, as shown in FIGS. 3 and 5. The array of electrically conductive terminals on the substrate and a surface of the heat slug are configured to mount the package to a PCB.

Figure 2D:
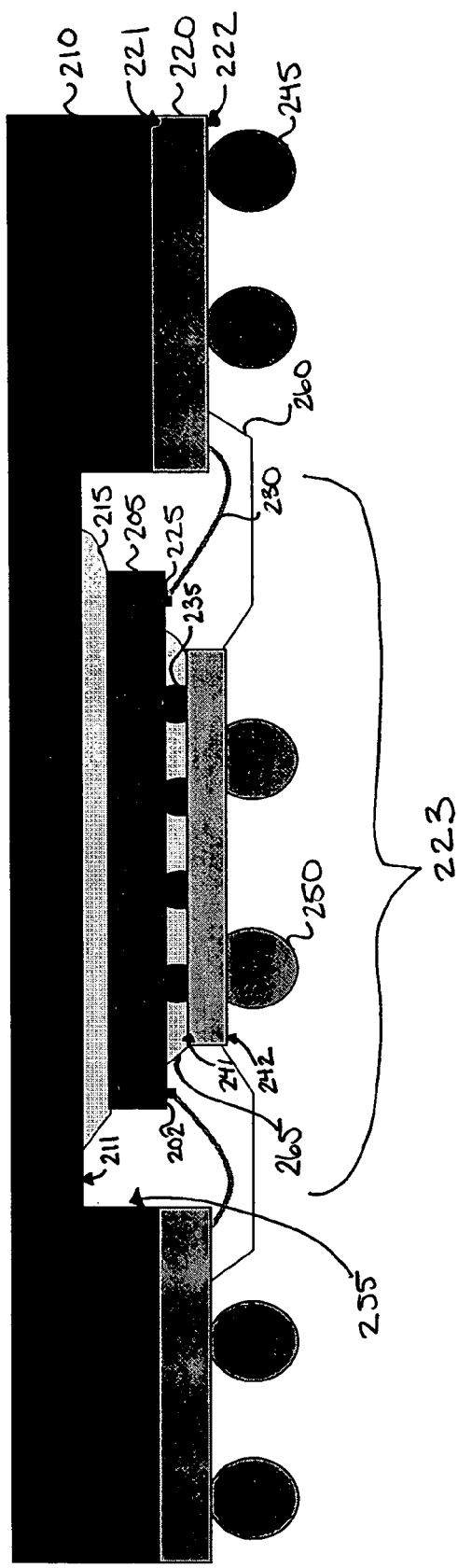
FIG. 2D illustrates the die-down BGA package shown in FIG. 2A, having an underfill material between the interposer and the IC die, in accordance with an example embodiment of the present invention.

In another example embodiment, flowchart 600 includes the step shown in FIG. 10A. In step 1005, a space between the active surface of the IC die and the interposer is filled in with an underfill material. For example, the IC die is IC die 205, the active surface of the IC die is active surface 202, the interposer is interposer 240, and the underfill material is underfill material 265, as shown in FIG. 2D.

In another example embodiment, flowchart 600 includes the step shown in FIG. 10B. In step 1010, the IC die and the wire bonds are encapsulated with an encapsulating material. For example, the IC die is IC die 205, the wire bonds are wire bonds 230, and the encapsulating material is encapsulating material 260, as shown in FIGS. 2A, 2D, and 3-5.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A die-down array integrated circuit (IC) device package, comprising:

a heat spreader having opposing first and second surfaces, wherein said first surface of said heat spreader has a central cavity formed therein;

a substrate having a first surface coupled to said first surface of said heat spreader, and having an array of electrically conductive terminals on a second surface, wherein said substrate further has a central opening that is open at said first and second surfaces of said substrate, wherein said central opening overlaps said central cavity;

an IC die having a first surface mounted to said first surface of said heat spreader within said central cavity;

at least one wire bond that couples at least one bond pad on a second surface of said IC die to at least one bond pad on said second surface of said substrate; and an interposer having opposing first and second surfaces, wherein a plurality of electrically conductive bumps on said second surface of said IC die is coupled to corresponding bond pads on said first surface of said interposer, wherein the interposer and the substrate are separate elements.

2. The die-down array IC device package of claim 1, wherein said array of electrically conductive terminals and said second surface of said interposer are configured to surface mount the package to a printed circuit board (PCB).

3. The die-down array IC device package of claim 1, wherein said second surface of said interposer has an array of electrically conductive terminals thereon, wherein said arrays of electrically conductive terminals on said second surfaces of said substrate and said interposer are configured to surface mount the package to a printed circuit board (PCB).

4. The die-down array IC device package of claim 3, wherein said arrays of electrically conductive terminals on said second surfaces of said substrate and said interposer include an array of electrically conductive balls, pins, studs, or pads.

5. The die-down array IC device package of claim 1, further comprising:

a heat slug having opposing first and second surfaces, wherein said first surface of said heat slug is coupled to said second surface of said interposer, wherein said array of electrically conductive terminals and said second surface of said heat slug are configured to surface the mount package to a printed circuit board (PCB).

6. The die-down array IC device package of claim 1, wherein said at least one bond pad comprises a plurality of bond pads located on a peripheral area of said second surface of said IC die.

7. The die-down array IC device package of claim 1, wherein said plurality of electrically conductive bumps is located on a central area of said second surface of said IC die.

8. The die-down array IC device package of claim 1, wherein said first surface of said IC die is coupled to said first surface of said heat spreader with an adhesive material.

9. The die-down array IC device package of claim 1, further comprising:

an encapsulating material, wherein said encapsulating material encapsulates said IC die and said at least one wire bond.

10. The die-down array IC device package of claim 1, further comprising:

an underfill material that fills a space between said second surface of said IC die and said first surface of said interposer.

11. The die-down array IC device package 1, wherein said heat spreader comprises:

a substantially planar body having opposing first and second surfaces, wherein said second surface of said substantially planar body comprises said second surface of said heat spreader; and a ring-shaped body having a central opening that is open at a first surface and a second surface of said ring-shaped body, wherein said first surface of said ring-shaped body is coupled to said first surface of said substantially planar body, and wherein said second surface of said ring-shaped body comprises said first surface of said heat spreader;

wherein said central opening through said ring-shaped body and a portion of said first surface of said substantially planar body that is exposed through said central opening through said ring-shaped body form said central cavity.

12. The die-down array IC device package of claim 11, wherein said array of electrically conductive terminals and said second surface of said interposer are configured to surface mount the package to a printed circuit board (PCB).

13. The die-down array IC device package of claim 11, wherein said second surface of said interposer has an array of electrically conductive terminals thereon, wherein said arrays of electrically conductive terminals on said second surfaces of said substrate and said interposer are configured to surface mount the package to a printed circuit board (PCB).

14. The die-down array IC device package of claim 13, wherein said arrays of electrically conductive terminals on said second surfaces of said substrate and said interposer include an array of electrically conductive balls, pins, studs, or pads.

15. The die-down array IC device package of claim 11, further comprising:

a heat slug having opposing first and second surfaces, wherein said first surface of said heat slug is coupled to said second surface of said interposer, wherein said array of electrically conductive terminals and said second surface of said heat slug are configured to surface mount the package to a printed circuit board (PCB).

16. The die-down array IC device package of claim 11, wherein said at least one bond pad comprises a plurality of bond pads located on a peripheral area of said second surface of said IC die.

17. The die-down array IC device package of claim 11, wherein said plurality of electrically conductive bumps is located on a central area of said second surface of said IC die.

18. The die-down array IC device package of claim 11, wherein said first surface of said IC die is coupled to said first surface of said heat spreader with an adhesive material.

19. The die-down array IC device package of claim 11, wherein said first surface of said ring-shaped body is coupled to said first surface of said substantially planar body with an adhesive material.

20. The die-down array IC device package of claim 11, further comprising:

an encapsulating material, wherein said encapsulating material encapsulates said IC die and said at least one wire bond.

21. The die-down array IC device package of claim 11, further comprising:

an underfill material that fills a space between said second surface of said IC die and said first surface of said interposer.

* * * * *

UNITED STATES PATENT AND TRADEMARK OFFICE
CERTIFICATE OF CORRECTION

PATENT NO. : 7,411,281 B2 Page 1 of 1
APPLICATION NO. : 10/870928
DATED : August 12, 2008
INVENTOR(S) : Tonglong Zhang It is certified that error appears in the above-identified patent and that said Letters Patent is hereby corrected as shown below:

Column 10, line 43, please replace, "surface the mount" with --surface mount the--.

Signed and Sealed this

Twenty-eighth Day of October, 2008

JON W. DUDAS
*Director of the United States Patent and Trademark Office*